(12) United States Patent
Hatakoshi et al.

(10) Patent No.: US 6,687,277 B2
(45) Date of Patent: *Feb. 3, 2004

(54) SEMICONDUCTOR LASER DEVICE

(75) Inventors: Genichi Hatakoshi, Yokohama (JP); Hideto Furuyama, Yokohama (JP)

(73) Assignee: Kabushiki Kaisha Toshiba, Kawaskai (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/372,914

(22) Filed: Feb. 26, 2003

(65) Prior Publication Data

US 2003/0165170 A1 Sep. 4, 2003

Related U.S. Application Data

(62) Division of application No. 09/749,801, filed on Dec. 28, 2000, now Pat. No. 6,587,494.

(30) Foreign Application Priority Data

Dec. 28, 1999 (JP) .............................. 11-373067

(51) Int. Cl.[7] .................................. H01S 5/00
(52) U.S. Cl. ........................ 372/49; 372/43; 372/103
(58) Field of Search .......................... 372/43, 45, 49, 372/96, 103

(56) References Cited

U.S. PATENT DOCUMENTS

| 4,840,922 A | 6/1989 | Kobayashi et al. |
|---|---|---|
| 5,412,680 A | 5/1995 | Swirthum et al. |
| 5,850,411 A | 12/1998 | Major, Jr. et al. |
| 5,978,139 A | 11/1999 | Hatakoshi et al. |
| 6,154,479 A | 11/2000 | Yoshikawa et al. |
| 6,314,122 B1 | 11/2001 | Peale |
| 6,587,494 B2 * | 7/2003 | Hatakoshi et al. ............ 372/49 |

OTHER PUBLICATIONS

Afshin Partovi, et al. "High–power laser light source for near–field optics and its application to high–density optical data storage", Applied Physics Letters, vol. 75, No. 11, Sep. 13, 1999, pp. 1515–1517.

* cited by examiner

*Primary Examiner*—Paul Ip
*Assistant Examiner*—James Menefee
(74) *Attorney, Agent, or Firm*—Oblon, Spivak, McClelland, Maier & Neustadt, P.C.

(57) ABSTRACT

Disclosed is a semiconductor laser device capable of minimizing the spot diameter of a laser light and also capable of improving the transmittance of light passing through a fine aperture. The semiconductor laser device comprises a light absorption film provided with a fine aperture on the outside of the light-emitting surface of the semiconductor laser element. The aperture is formed such that the aperture width $W_1$ in a direction parallel to the polarizing direction of the laser light is smaller than half the oscillation wavelength of the semiconductor laser element, and the aperture width $W_2$ in a direction perpendicular to the polarizing direction is larger than the aperture width $W_1$.

13 Claims, 10 Drawing Sheets

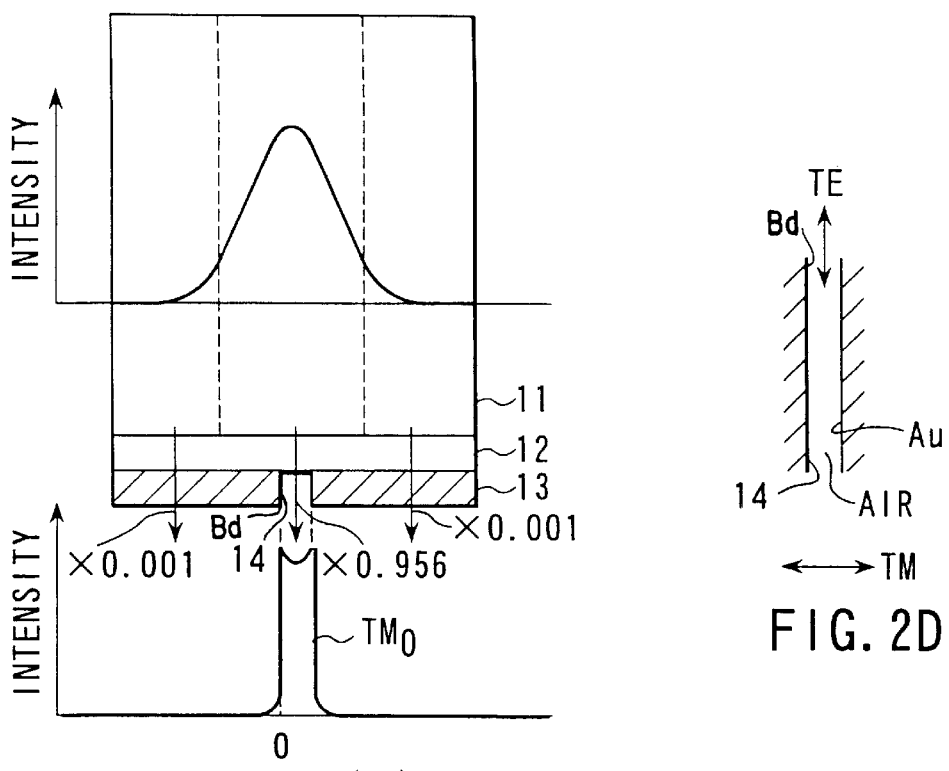
FIG. 2C
FIG. 2D
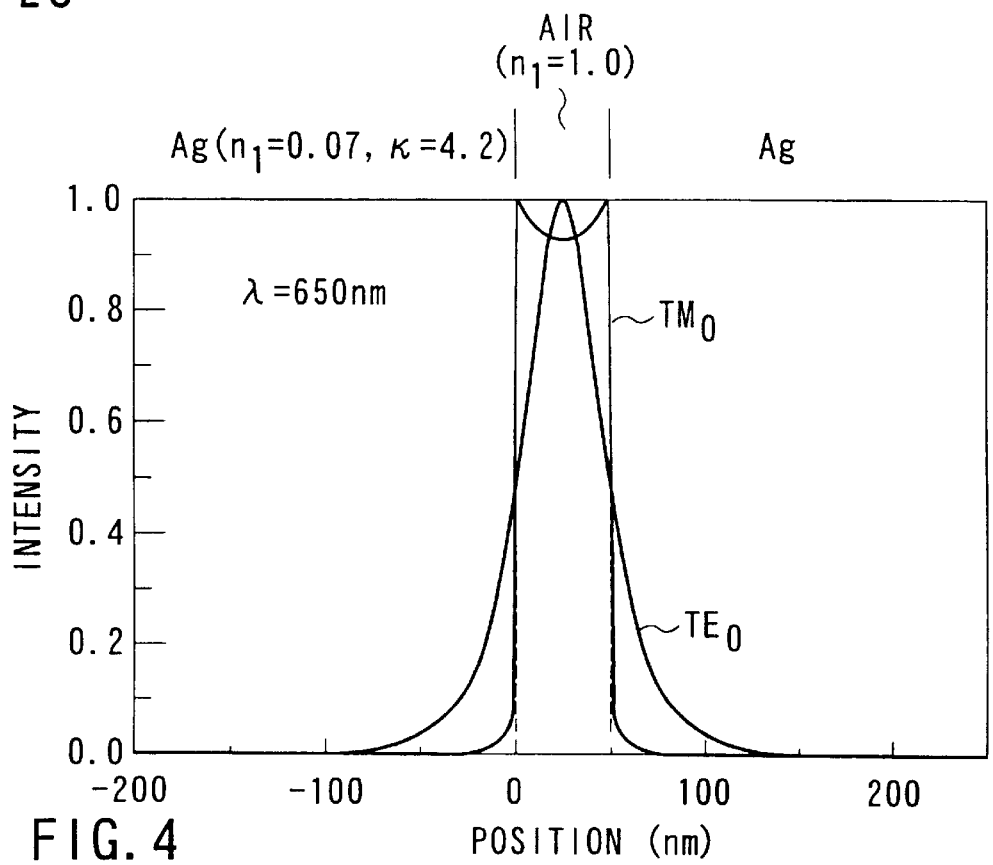
FIG. 4

SEMICONDUCTOR LASER DEVICE

CROSS-REFERENCE TO RELATED APPLICATIONS

This application is a division of U.S. patent application Ser. No. 09/749,801, filed Dec. 28, 2000, now U.S. Pat. No. 6,587,494.

This application is based upon and claims the benefit of priority from the prior Japanese Patent Application No. 11-373067, Dec. 28, 1999, the entire contents of which are incorporated herein by reference.

BACKGROUND OF THE INVENTION

The present invention relates to a semiconductor laser device, particularly, to a semiconductor laser device provided with a light absorption film having an aperture on the outside of a light-emitting surface.

In order to improve the recording density of an optical disc, required are a light source and an optical system capable of converging the laser light on a minimal spot. In general, the diffraction-limited spot diameter s of the converged light relative to the wavelength $\lambda$ of the light source and the numerical aperture NA of the converging lens is determined by formula (1) given below:

i.e., $s = c\lambda/NA$ \qquad (1)

When it comes to a laser light having a cross sectional light intensity conforming with, for example, the Gaussian distribution and a diameter in which the light intensity in the edge portion is $1/e^2$ times as high as the light intensity in the central portion, the coefficient c in formula (1) is 0.67. In general, the numerical aperture NA of the lens is at most 1. It follows that it is impossible for the diffraction-limited spot diameter s to be smaller than $c\lambda$, as apparent from formula (1).

As apparent from formula (1), an effective method for obtaining a spot light having a minimal diameter is to shorten the wavelength $\lambda$ of the light source. However, in the case of using a semiconductor laser, the shortening of the wavelength $\lambda$ is limited. Also, if the wavelength of the light source is shorter than that of an ultraviolet light, it is impossible to use the conventional optical system because of the restriction in the transparent region of the lens material.

On the other hand, as a method for exceeding the limit represented by formula (1), it is proposed to utilize a solid immersion lens (SIL) or an optical near field. The optical near field is generated when a laser light passes through a circular aperture mounted at the light-emitting edge and having a diameter smaller than the wavelength $\lambda$ of the light source. The optical near field thus generated is utilized by disposing a disc plane in the vicinity of the aperture. To be more specific, a laser light is formed into an optical near field having a diameter smaller than the diffraction-limited spot diameter s when the laser beam passes through the aperture, and the optical near field thus formed is utilized for recording information in an optical disc and for reading the recorded information from the optical disc.

However, a serious problem is inherent in the optical near field that the throughput efficiency of the optical near field is very low. Specifically, the aperture is formed in general in a plane of a light absorption material having a large optical absorption. It should be noted that a material having a very large absorption loss and a thickness large enough to inhibit the light transmission such as a metal material is used as the light-absorbing material so as to inhibit the light transmission in regions other than the aperture.

When passing through the aperture of the light-absorbing material, the laser light is absorbed by the light-absorbing material in the vicinity of the aperture, with the result that the laser light intensity is rendered insufficient on the emission side. In other words, the throughput efficiency of the optical near field is very low and, thus, it is impossible to use the optical near field for the optical recording/reading.

On the other hand, it is conceivable to use a high power laser as a measure for making up for the low throughput efficiency of the optical near field. However, in the construction that a light-absorbing material is mounted on the facet of a high power laser, the temperature in the vicinity of the facet is markedly elevated by the heat generation caused by the light absorption so as to deteriorate the laser facet. It follows that this measure is not practical.

As described above, in the conventional semiconductor laser device in which a small aperture is formed in the light-emitting surface, the efficiency for the laser light to pass through the aperture is very low, making it impossible to use the conventional semiconductor laser device for the optical recording. On the other hand, if a high power laser is used as a measure against the low throughput efficiency, the temperature in the vicinity of the laser facet is markedly elevated so as to deteriorate the high power laser.

BRIEF SUMMARY OF THE INVENTION

An object of the present invention is to provide a semiconductor laser device capable of minimizing the spot diameter of the laser light and high in the optical throughput efficiency through an aperture.

The present invention has been achieved on the basis of the properties found by the present inventors that, when the aperture width is very small, the degree of light absorption differs depending on the polarizing direction of the laser light. It should be noted that the technical idea of the present invention resides in that the direction of the short aperture width of a small aperture is set parallel to the polarizing direction of the semiconductor laser element so as to improve the optical throughput efficiency through the aperture.

To be more specific, the present invention provides a semiconductor laser device comprising a semiconductor laser element and a light-absorbing film having an aperture formed on the outside of the light-emitting surface of the semiconductor laser element, characterized in that the aperture is formed such that the aperture width $W_1$ in a direction parallel to the polarizing direction of the laser light is smaller than the aperture width $W_2$ in a direction perpendicular to the polarizing direction.

The present invention also provides a semi-conductor laser device comprising a semiconductor laser element and a light-absorbing film having an aperture formed on the outside of the light-emitting surface of the semiconductor laser element, wherein the aperture is formed such that the aperture width $W_1$ in a direction parallel to the polarizing direction of the laser light is smaller than half the oscillation wavelength of the semiconductor laser element, and the aperture width $W_2$ in a direction perpendicular to the polarizing direction is larger than the aperture width $W_1$.

The semiconductor laser devices according to preferred embodiments of the present invention are featured mainly as follows:

(a) A dielectric film is arranged between the light-emitting surface and the light-absorbing film. It is possible for the dielectric film to be formed, as desired, to fill the aperture.

(b) The aperture width of the aperture in a direction parallel to the polarizing direction of the laser light is set to fall within a range in which the absorption loss of the laser light is made smaller by at least one place than that in the case where an aperture of the same width is formed to extend in a direction perpendicular to the polarizing direction of the laser light.

(c) The width of the aperture in a direction parallel to the polarizing direction of the laser light is shorter than one-third of the oscillating wavelength of the semiconductor laser element.

(d) The semiconductor laser element is of an edge-emitting type and has an oscillation mode of TM mode.

(e) The light absorption film is made of a metal.

(f) An insulating film is arranged between the light-emitting surface and the light-absorbing film, and the optical thickness of the insulating film falls within a range of between $0.05\lambda$ and $0.35\lambda$ relative to the oscillating wavelength $\lambda$.

The present inventors have found that the loss of the laser light in the small aperture is dependent on the polarizing direction of the laser light and on the shape of the aperture. To be more specific, the loss is increased if the aperture width in a direction perpendicular to the polarizing direction of the laser light is narrowed, and the loss is not increased even if the aperture width is narrowed in a direction parallel to the polarizing direction of the laser light. The specific reason for this principle will be described herein later.

It follows that, if the aperture width $W_1$ in a direction parallel to the polarizing direction of the laser light, the aperture being formed on the outside of the light-emitting surface of the semiconductor laser element, is made smaller than the aperture width $W_2$ in a direction perpendicular to the polarizing direction of the laser light as in the present invention, it is possible to obtain a spot light having a smaller diameter without increasing the absorption loss around the aperture. It follows that it is possible to minimize the spot diameter of the laser light so as to obtain a semiconductor laser device having a high light transmission efficiency through the aperture.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2C schematically shows the light intensity distribution for explaining the calculation examples shown in FIGS. 2A and 2B;

FIG. 2D schematically shows the relationship between the aperture and the waveguide mode;

FIG. 4 shows an example of analysis of the waveguide mode for Ag in the first embodiment of the present invention;

DETAILED DESCRIPTION OF THE INVENTION

The present invention will now be described in detail with reference to the embodiments shown in the accompanying drawings.

First Embodiment

Figure 1A:
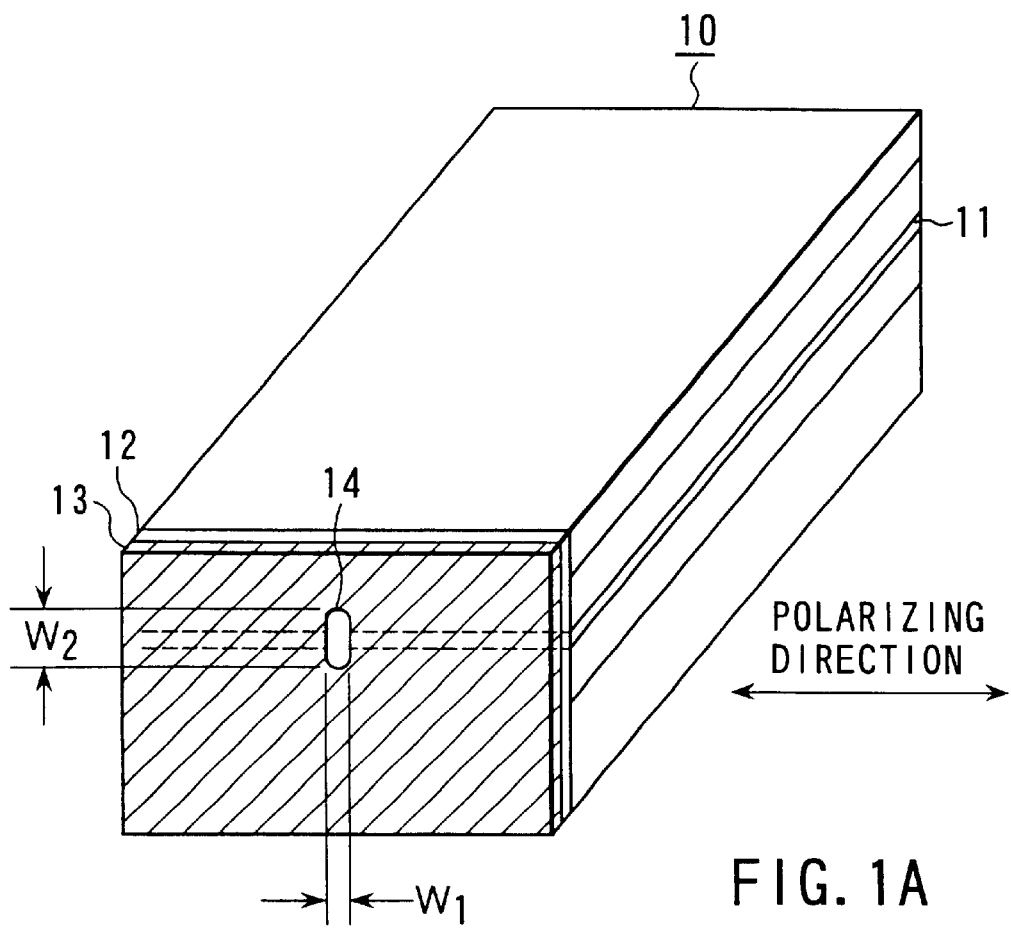
FIG. 1A is an oblique view schematically showing the construction of a semiconductor laser device according to a first embodiment of the present invention.

FIG. 1A is an oblique view schematically showing the construction of a semiconductor laser device according to a first embodiment of the present invention. As shown in the drawing, the semiconductor laser device comprises a semiconductor laser element 10 having an active layer 11 formed therein and also having a facet to which a light-emitting plane belongs protected by an insulating film 12, and a light-absorbing film 13 having an aperture 14 and mounted to the semiconductor laser element 10.

The aperture 14 is formed in a position facing a part of the light-emitting plane and serves to transmit a part of the laser light emitted from the semi-conductor laser element. To be more specific, the aperture 14 serves to form the intensity distribution of the laser light into a width smaller than the oscillating wavelength $\lambda$ when the laser light emitted from the semiconductor laser element 10 passes through the aperture 14. Also, in the drawing, the aperture 14 is shaped oblong in which each of the four corners of the aperture 14 in a planar shape is arcuate. Alternatively, it is possible for the aperture 14 to be shaped rectangular in which each of the four corner portions in a planar shape has a right angle. The aperture 14 may be a slit. The construction of the aperture 14 described above is also employed in any of the embodiments described below.

The semiconductor laser element 10 is oscillated in a TE mode, and the polarizing direction of the laser light is in parallel to the junction plane, i.e., the direction of the electric field vector is equal to a horizontal direction.

Figure 1B:
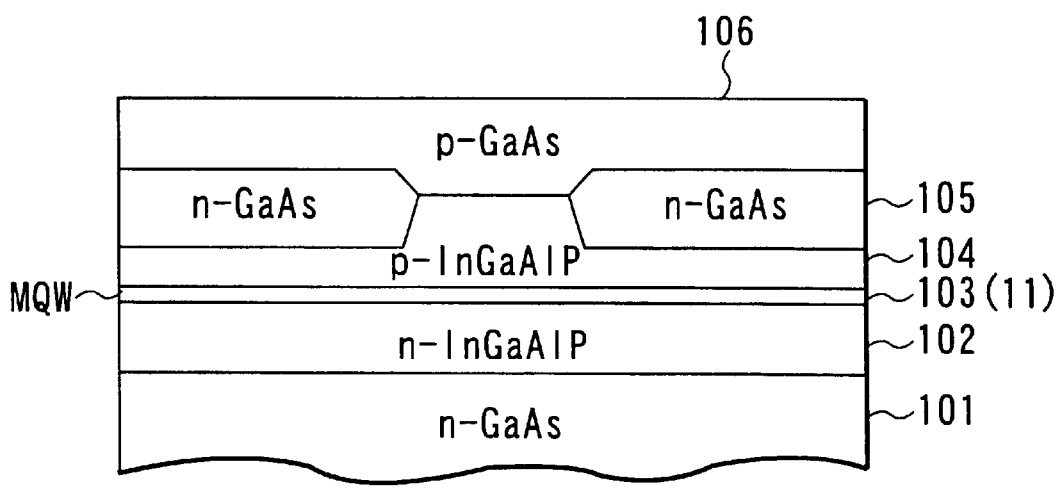
FIG. 1B is a cross sectional view schematically showing the construction of the semiconductor laser device in the first embodiment of the present invention.

FIG. 1B is a cross sectional view showing as an example the construction of the semiconductor laser element 10. As shown in the drawing, the semiconductor laser element 10 comprises an n-type GaAs substrate 101, an n-type InGaAlP clad layer 102, an active layer 103 (11) comprising an InGaAlP multilayered quantum well structure (MQW), a p-type InGaAlP clad layer 104, an n-type GaAs current blocking layer 105, and a p-type GaAs contact layer 106, which are laminated one upon the other in the order mentioned. Also, the clad layer 104 is formed into a mesa shape and the current blocking layers 105 are embedded on the both side regions so as to form a ridge stripe laser. Where the active layer 11 comprising the MQW (103), the active layer 11 is of a laminate structure comprising well layers each having a thickness of several nanometers and barrier wall layers each having a thickness of several nanometers, which are alternately laminated one upon the other. Also, where the active layer 11 is in the form of a bulk, the active layer 11 has a thickness of, for example, 0.05 to 0.06 $\mu$m. Needless to say, the cross sectional construction of the semiconductor laser element 10 is not limited that shown in FIG. 1B, and it is possible to employ various modifications.

It is possible to use, for example, $SiO_2$, $TiO_2$, $Ta_2O_5$, and $\alpha$-Si, for forming the insulating film 12. The insulating layer 13 belongs to the semiconductor laser element 10 and plays the role of the protective film of the facet of the semiconductor laser element and the role of preventing the short circuit between the n-type semiconductor layer and the p-type semi-conductor layer caused by the light-absorbing film 13.

It is possible to use a metal such as Au, Ag, Cu, Al, Pt or Ti for forming the light-absorbing film 13. Since a metal has a very large absorption coefficient, the light is substantially prevented from being transmitted through the light-absorbing film 13 except the aperture region, if the light-absorbing film 13 has a thickness of, for example, about 100 nm. However, the loss of light passing through the aperture has not yet been analyzed sufficiently. In an ordinary small aperture, the light passing through the aperture also incurs a large loss, giving rise to the problem that the efficiency is very low.

The present invention is featured in that the aperture width $W_1$ in a direction parallel to the polarizing direction of the laser light is made smaller than the aperture width $W_2$ in a direction perpendicular to the polarizing direction of the laser light. To be more specific, the aperture width $W_1$ in a direction parallel to the polarizing direction of the laser light is made smaller than half the oscillating wavelength of the semiconductor laser, and the aperture width $W_2$ in a direction perpendicular to the polarizing direction of the laser light is made longer than the aperture width $W_1$ noted above. The particular construction makes it possible to markedly diminish the loss of the light passing through the aperture. The principle of the particular function will now be described.

Figure 2A:
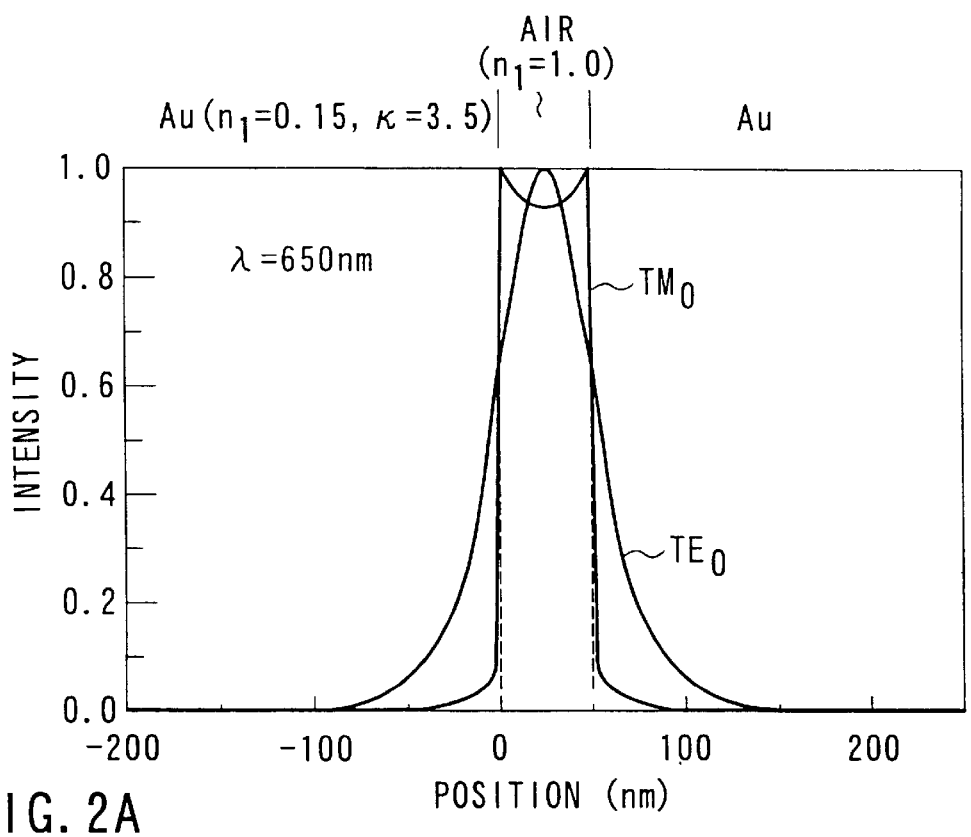
FIGS. 2A and 2B show examples of calculating the waveguide mode within a metal waveguide in the first embodiment of the present invention.
Figure 2B:
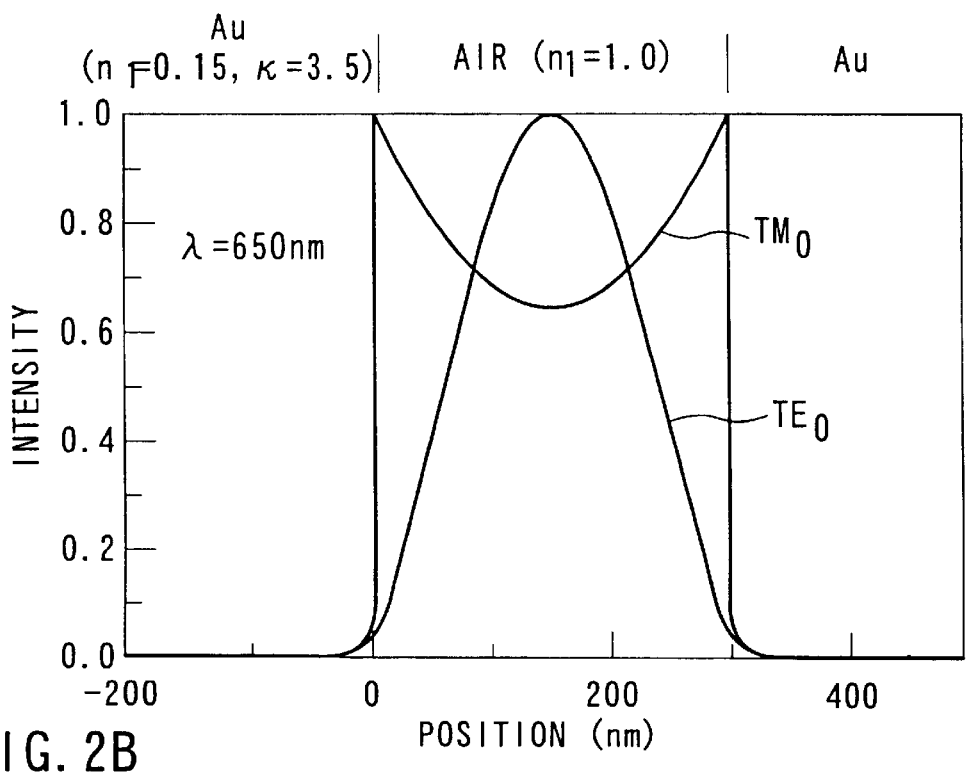

Specifically, FIGS. 2A and 2B show an example of calculating the waveguide mode in a metal waveguide. The calculating example is directed to the light intensity distribution, covering the case where the laser light having a cross sectional intensity conforming with the distribution sufficiently larger than the aperture width and emitted from the active layer 11 passes through the aperture 14 extending through the insulating film 12 and the light-absorbing film 13 is outputted to the outside (FIG. 2C).

For brevity, the waveguide nodes were calculated for two cases where the small aperture 14 having a width of 50 nm (FIG. 2A) was formed in the light-absorbing film 13 made of gold (Au) and where the small aperture 14 having a width of 300 nm (FIG. 2B) was formed in the film 13. Incidentally, $n_1$ in the drawings denotes the real part of the complex refractive index n, and $\kappa$ represents the extinction coefficient in the imaginary part of the complex refractive index n ($n=n_1-i\kappa=0.15-3.5i$).

As shown in the drawings, the TE mode, in which the direction of the electric field vector is parallel to the boundary Bd between the gold layer in the longitudinal direction of the aperture 14 and the air (FIG. 2D), and the TM mode, in which the direction of the magnetic field vector is parallel to the boundary noted above, widely differ from each other in the distribution shape of the mode. The boundary Bd is located at the position 0 on one of outer edges of the aperture 14 as shown in FIG. 2C. Incidentally, the TE mode and the TM mode noted above, which differ from the oscillation mode of the semiconductor laser element 10, denote the laser light in the cross section defined in the boundary direction (longitudinal direction) of the aperture 14. AS described previously, the oscillation mode is the TE mode.

The light intensity in each of FIGS. 2A and 2B denotes the component in the propagating direction of the Poynting vector. The discontinuity of the light intensity at the interface between the air layer and the metal layer in the TM mode is derived from the discontinuity of the component of the electric field vector in a direction perpendicular to the boundary face. To be more specific, since the amount of continuity is equal to the product between the component of the electric field vector in a direction perpendicular to the boundary face and $n^2$, the light intensity is markedly diminished within the metal having a large absolute value of the real part of $n^2$ by the coefficient of $1/n^2$.

On the other hand, the TE mode is a mode in which the permeation into the metal layer is large because the electric field of the TE mode is directed parallel to the boundary and is continuous at the boundary between the air and the metal.

If the aperture width is relatively large, the permeation of the TE mode is not prominent as shown in FIG. 2B. However, if the aperture width is small, the TE mode and the TM mode widely differ from each other in the permeation rate such that the permeation of the TE mode is rendered prominent, as shown in FIG. 2A.

In the TE mode, the permeating portion into the metal layer incurs a large absorption loss and, thus, the loss of the waveguide mode is large where the aperture width is small. In the TM mode, however, the loss of the waveguide mode is very small even if the aperture width is small because the permeation into the metal layer is small as described above.

The embodiment shown in FIGS. 1A and 1B utilizes the feature described above. To be more specific, by utilizing the feature that the loss is not increased even if the aperture width is diminished in a direction parallel to the polarizing direction of the laser light, the aperture width $W_1$ in the direction noted above is decreased so as to make it possible to obtain a fine spot light with a high efficiency.

Figure 3A:
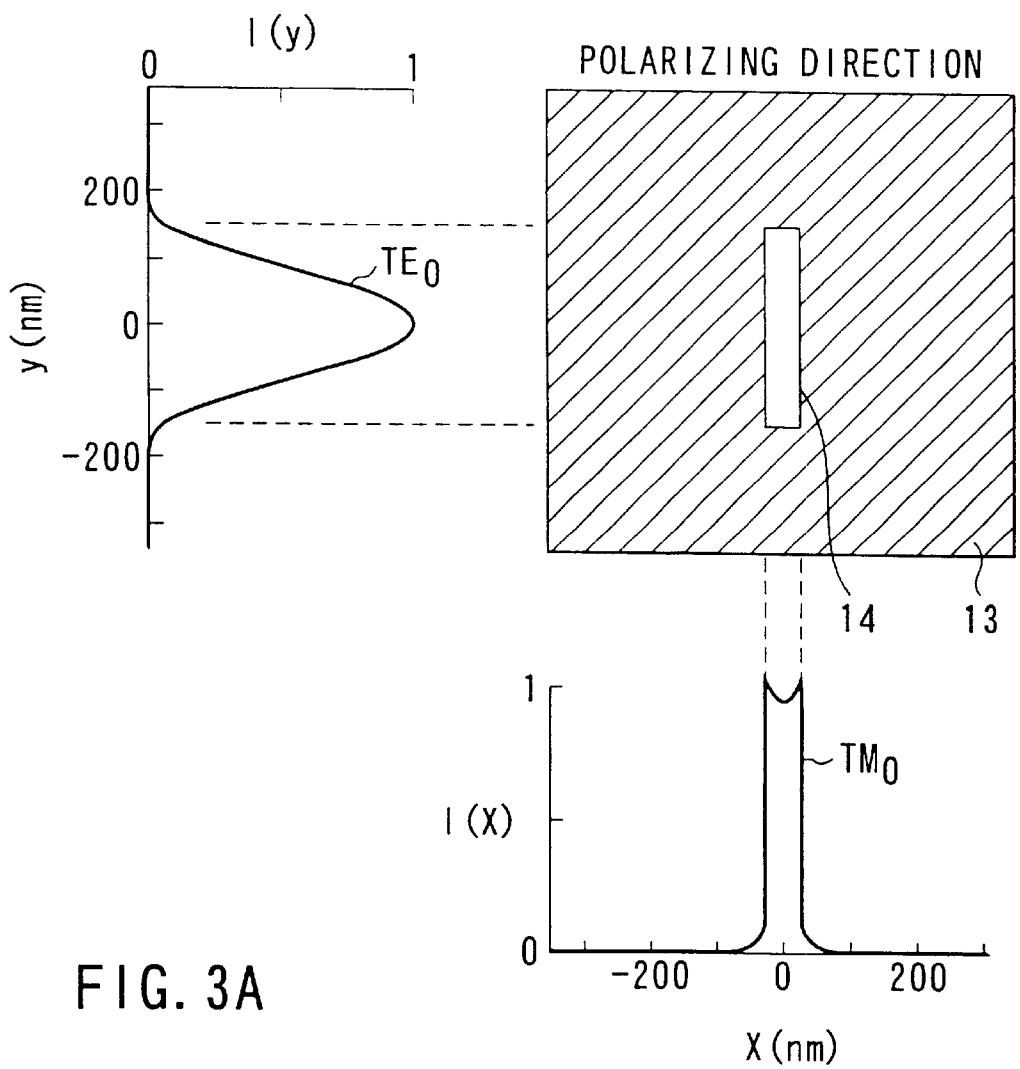
FIG. 3A shows the shape of the aperture and the light intensity distribution in each direction.
Figure 3B:
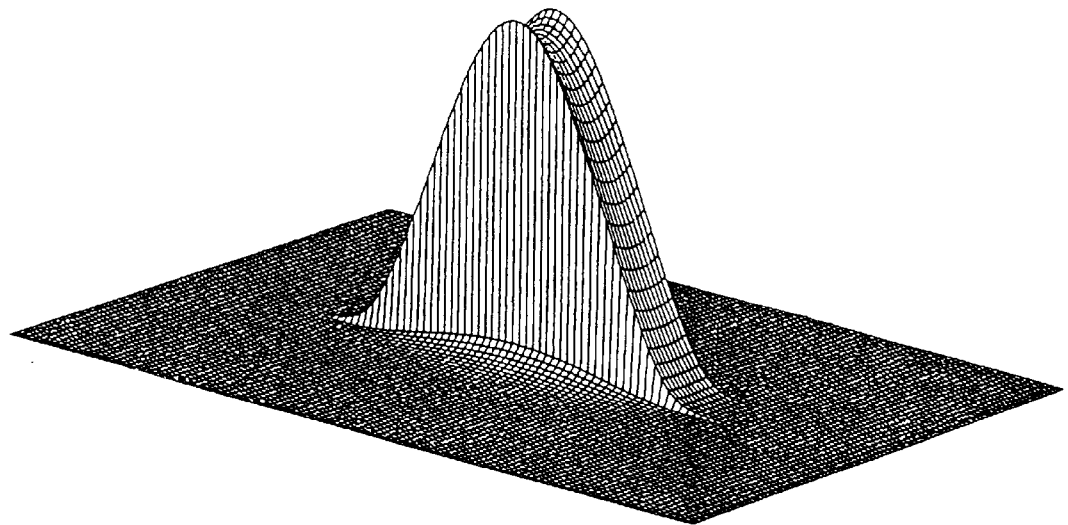
FIG. 3B shows in the form of a three dimensional distribution the light intensity distribution shown in FIG. 3A.

FIG. 3A shows the shape of the aperture and the light intensity distribution in each direction. On the other hand, FIG. 3B shows in the form of a three dimensional distribution the light intensity distribution shown in FIG. 3A. By setting the shape of the aperture as shown in FIG. 3A in the polarizing direction of the laser light, it is possible to achieve a waveguide mode having a very small loss even in a fine aperture smaller than the wavelength.

The description given above with reference to FIGS. 2A to 2D, 3A and 3B covers the case where a fine aperture is formed in an absorption thin film made of gold. However, the same effect can also be obtained in the case where the fine aperture is formed in a thin film made of another metal, e.g., silver (Ag). FIG. 4 shows an example of the analysis of the waveguide mode in the case where the fine aperture is formed in a thin Ag film. As apparent from the drawing, the permeation of the TM mode is also small, leading to a small loss.

Figure 5:
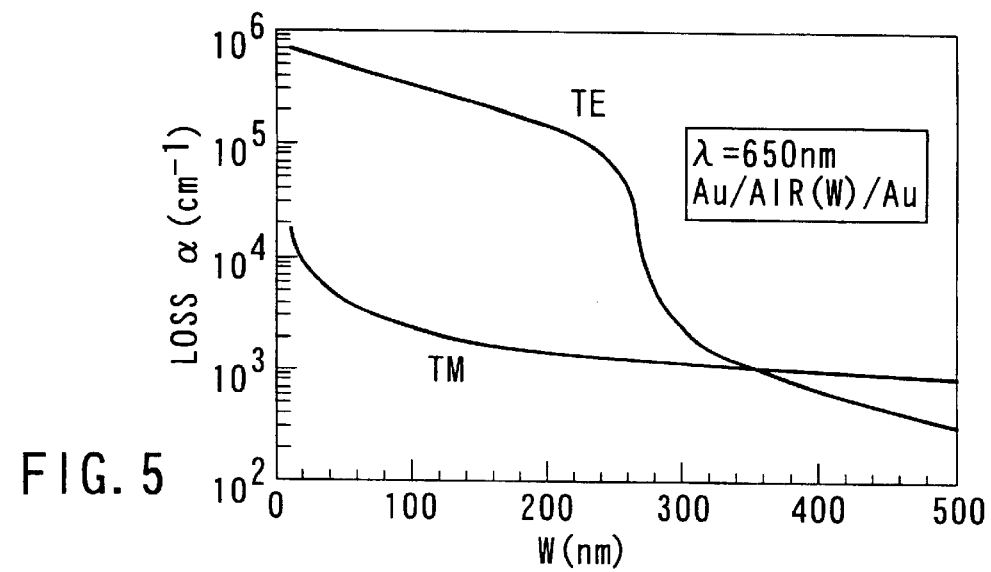
FIG. 5 shows an example of calculating the dependence of the waveguide mode loss in a Au waveguide on the aperture width W in the first embodiment of the present invention ($\lambda$=650 nm)
Figure 6:
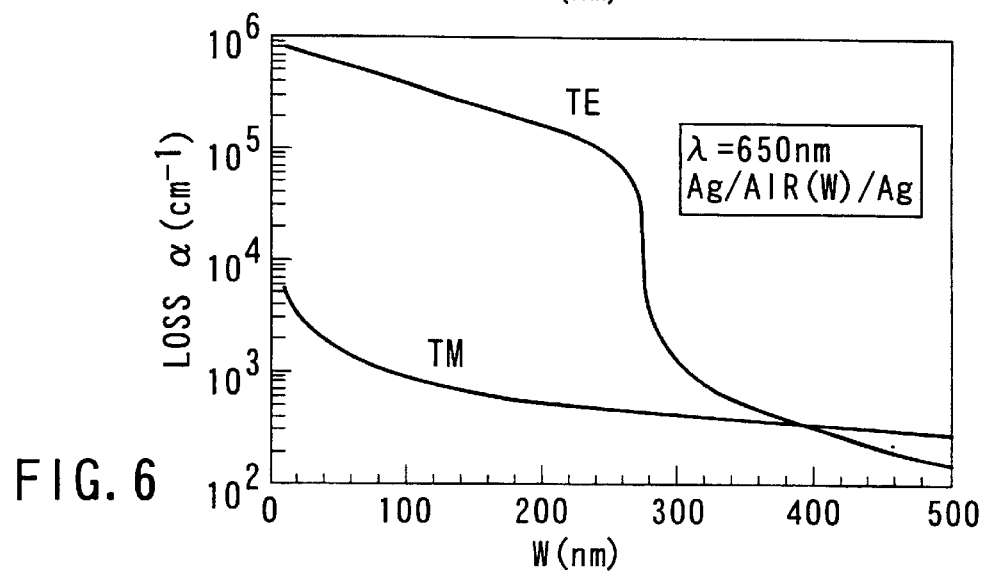
FIG. 6 shows an example of calculating the dependence of the waveguide mode loss in a Ag waveguide on the aperture width W in the first embodiment of the present invention ($\lambda$=650 nm)
Figure 7:
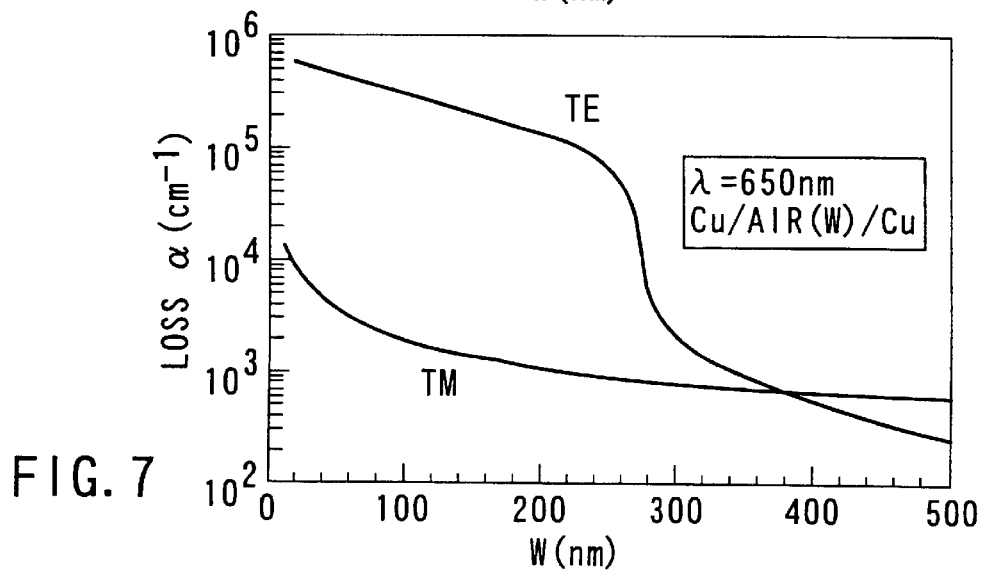
FIG. 7 shows an example of calculating the dependence of the waveguide mode loss in a Cu waveguide on the aperture width W in the first embodiment of the present invention ($\lambda$=650 nm)
Figure 8:
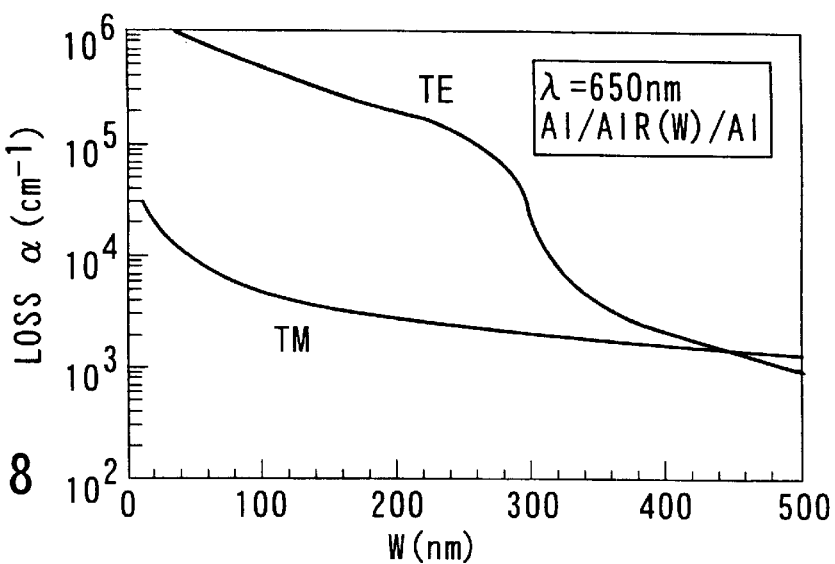
FIG. 8 shows an example of calculating the dependence of the waveguide mode loss in an Al waveguide on the aperture width W in the first embodiment of the present invention ($\lambda$=650 nm)
Figure 9:
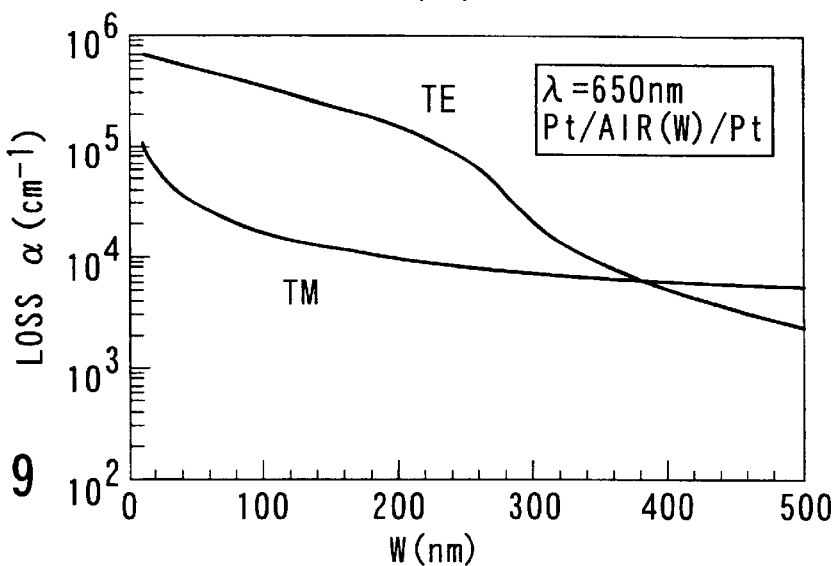
FIG. 9 shows an example of calculating the dependence of the waveguide mode loss in a Pt waveguide on the aperture width W in the first embodiment of the present invention ($\lambda$=650 nm)
Figure 10:
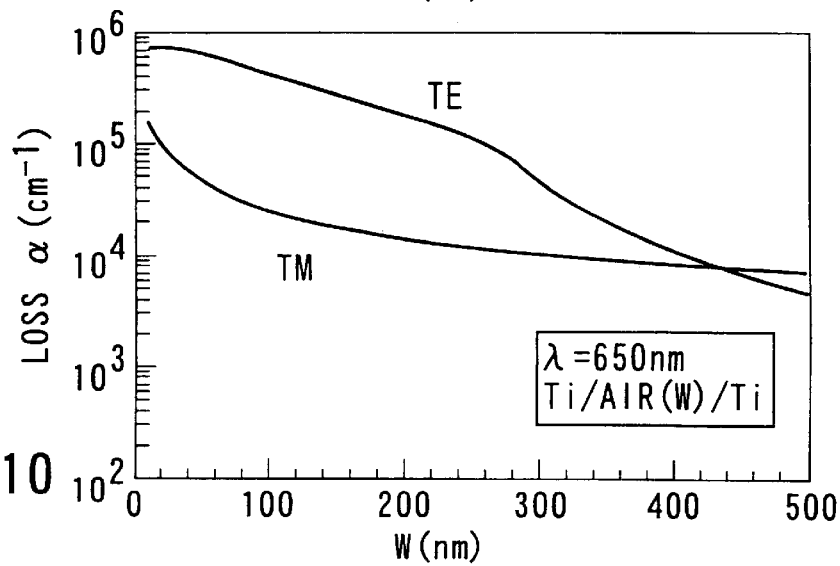
FIG. 10 shows an example of calculating the dependence of the waveguide mode loss in a Ti waveguide on the aperture width W in the first embodiment of the present invention ($\lambda$=650 nm)

FIG. 5 is a graph exemplifying a calculation of the dependence of the waveguide mode loss in the Au waveguide on the aperture width W. In the graph of FIG. 5, the absorption coefficient α of the light absorption film 13 for every waveguide mode is plotted as a loss α in the ordinate, with the position in the direction of the aperture width based on the reference position set at the left edge of the aperture 14 being plotted on the abscissa. It is clearly seen from FIG. 5 that, in the region of a small aperture width, the loss of the TM mode is very much lower than that of the TE mode. In other words, the loss of the TE mode is about 100 times as high as that of the TM mode. The experimental data given in FIG. 5 quantitatively support that the loss is markedly diminished by using the TM mode in which the direction of the polarization is perpendicular to the side of the aperture, in respect of the direction of the small aperture width.

To be more specific, where an aperture of 50 nm is formed in a Au film having a thickness d of 100 nm, the transmittance through the light absorption film 13 calculated on the basis of λ and α shown in FIG. 5 and κ shown in FIG. 2 are as follows:

| | |
|---|---|
| Transmittance $e^{(4\pi/\lambda)\kappa d}$ for the region outside aperture 14: | 0.001 |
| Transmittance $e^{\alpha d}$ of TE mode for aperture 14: | 0.006 |
| Transmittance $e^{\alpha d}$ of TM mode for aperture 14: | 0.956 |

It follows that the light is sufficiently attenuated when the light passes through the light absorption film 13 having a thickness d and, in the TM mode, the light is capable of passing through the aperture while substantially incurring no loss, which are also shown in FIG. 2C. On the other hand, in the TE mode, the light is scarcely transmitted through the aperture having an aperture width of about 50 nm. As apparent from FIG. 5, the loss can be lowered in the TE mode by setting the aperture width at 260 nm or more. It follows that it is possible to obtain a spot light very low in loss and very small in size, if the aperture is shaped such that the width in a direction parallel to the polarization direction of the laser light is small and the width in a direction perpendicular to the polarization direction of the laser light is large, as shown in FIGS. 1A or 3A.

In the embodiment shown in FIG. 1A, the aperture 14 is vertically long because the laser light is polarized in the horizontal direction. To be more specific, in the embodiment shown in FIG. 1A, the aperture width $W_1$ in the horizontal direction is smaller than half the wavelength and the aperture width $W_2$ in the vertical direction is larger than $W_1$. The results of calculation given above clearly support that the loss of light passing through the aperture is very low even if the aperture width $W_1$ is set at a very small value of 50 nm. It follows that it is possible to achieve the optical recording/reading with a spot light having a diameter which is one place smaller than the wavelength λ.

Incidentally, the aperture width $W_1$ is not limited to 50 nm or a value smaller than λ/2. For example, on the basis of comparison with the case where an aperture of the same width is formed to extend in the vertical direction (TE mode), it is desirable to set the aperture width $W_1$ to fall within a range in which the absorption loss relative to the laser light is diminished by one place, i.e., $W_1 \leq 260$ nm. To be more specific, it is desirable to set the aperture width $W_1$ in FIG. 5 at an optional value falling within a range (W≦260 mm) in which the absorption loss α of the TM mode is made smaller than the absorption loss α of the TE mode by at least one order of magnitude on the basis of the relationship among the absorption loss α in the TE mode of the light absorption film 13 when the direction perpendicular to the polarization direction is made equal to the direction of the aperture width W, the absorption loss α in the TM mode of the light absorption film 13 when the polarization direction is equal to the direction of the aperture width W, and the size of the aperture width W.

It is also effective to use a metal other than Au used in the embodiment described above for forming the light absorption film 13. FIGS. 6 to 10 show examples of calculation of the loss for each of the TE mode and the TM mode in the cases of using Ag, Cu, Al, Pt and Ti, respectively, for forming the light absorption film 13. In any of these cases, the loss in the TM mode is lower than that of the TE mode. Also, the difference in the loss is about two orders of magnitude or more in each of using Ag, Cu and Al for forming the light absorption film 13 as in the case of using Au for forming the film 13, supporting that the metals exemplified above are highly effective when used for forming the light absorption film.

Figure 11:
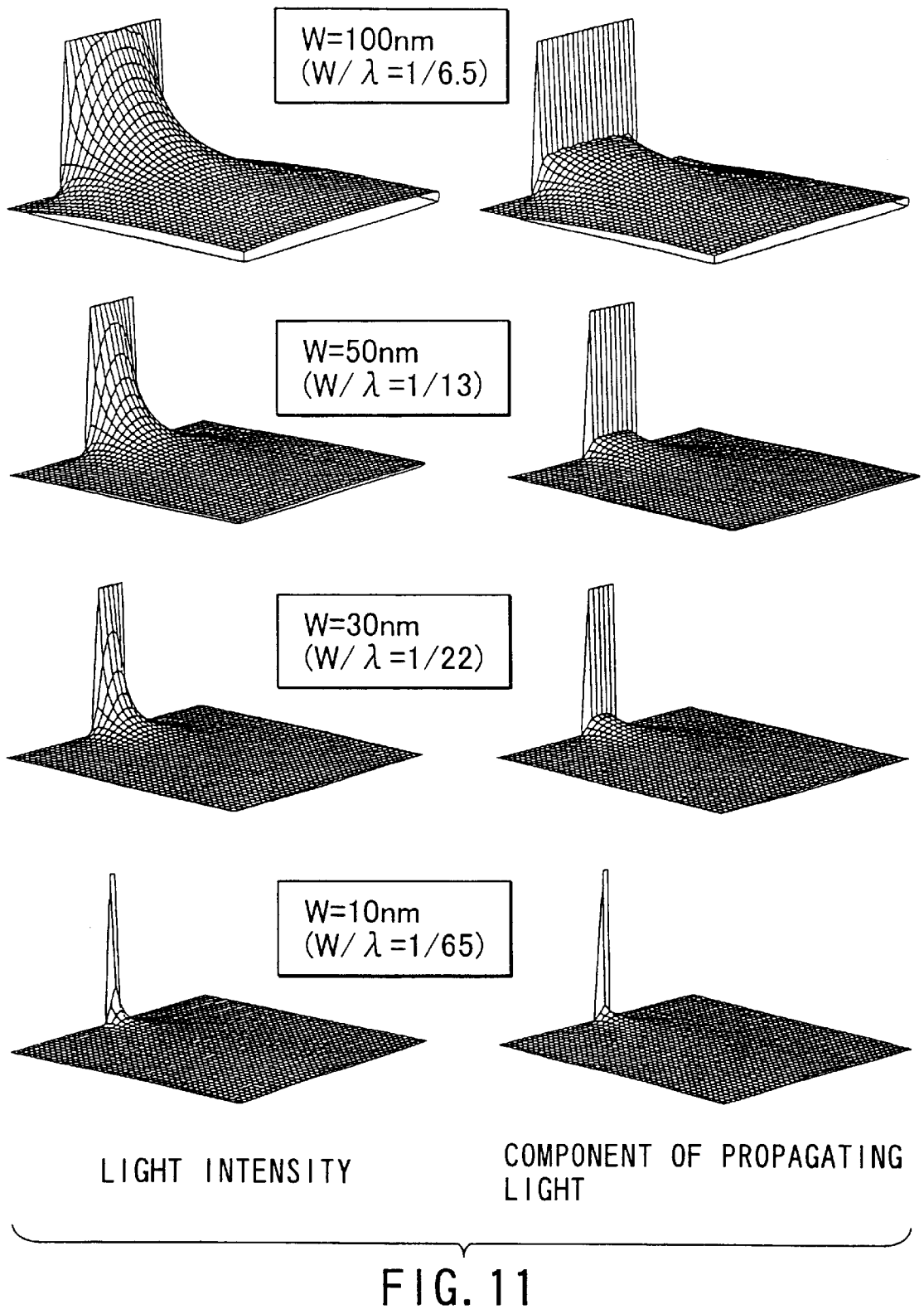
FIG. 11 shows the light intensity distribution after the light is emitted from the aperture into the air atmosphere in the first embodiment of the present invention.

The light intensity distribution after emission from the aperture 14 will now be described. FIG. 11 shows the light intensity distribution after the light is emitted from the aperture into the air atmosphere. The drawings on the left side of FIG. 11 show the entire light intensity distribution including the evanescent light, and the drawings on the right side show the propagating light components, i.e., the Poynting vector components. As apparent from FIG. 11, the propagating light component is increased with increase in the ratio W/λ of the aperture width to the laser wavelength. Since the light actually utilized consists mainly of the propagating light component, it is desirable for the ratio W/λ to be large. On the other hand, it is necessary to diminish the value of W in order to obtain a fine spot. It follows that, in obtaining a fine spot, it is advantageous for the wavelength λ of the laser light to be short.

Figure 12:
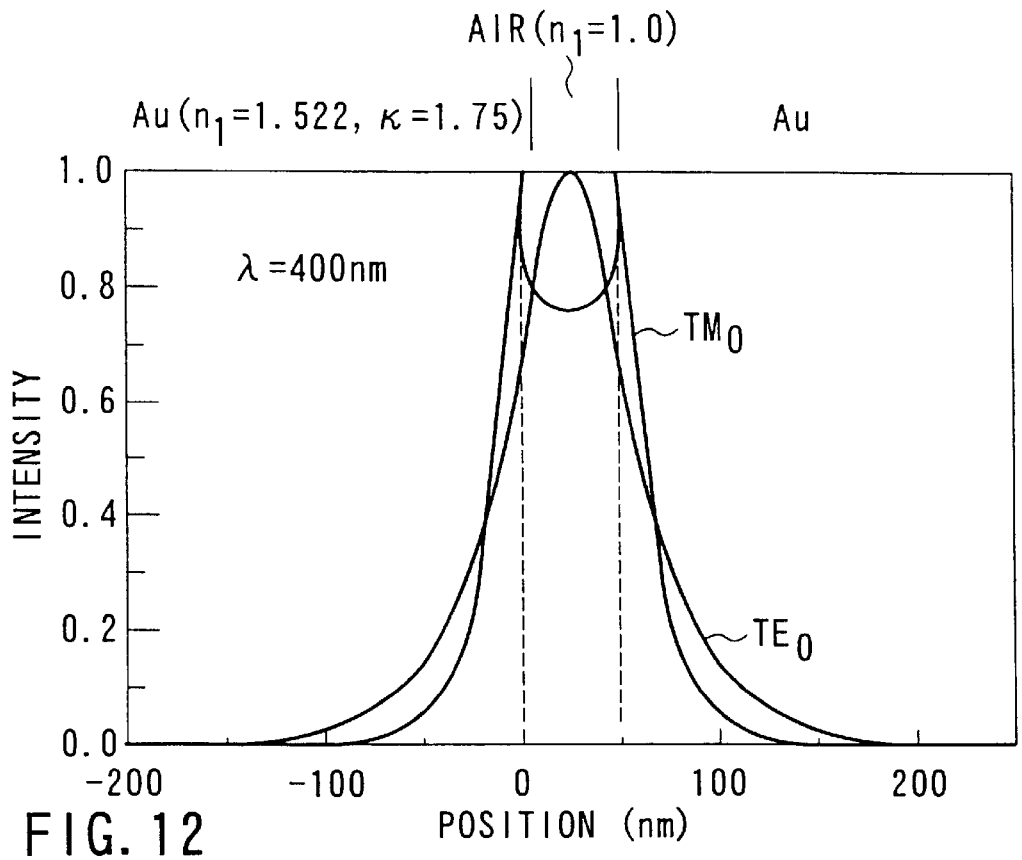
FIG. 12 shows the state of the waveguide mode relative to a Au aperture in the first embodiment of the present invention, covering the case where the light source wavelength is 400 nm.

On the other hand, where the wavelength of the light source is short, it is necessary to arrange an absorption film adapted for the short wavelength. FIG. 12 shows the situation of the waveguide mode in the case where wavelength of the light source is 400 nm in respect of the aperture formed in a gold thin film shown in FIG. 2A. What should be noted is that the permeation for the TM mode is large unlike the situation shown in FIG. 2A in spite of the fact that the aperture is formed in a gold thin film. The reason for the particular situation is that, in the wavelength of 400 nm, the absolute value in the real part of $n^2$ in a gold film ($n_1^2 - \kappa^2 = 1.552^2 - 1.75^2 = -0.746$) is smaller than 1 and, thus, the electric field intensity within the metal film is increased by the coefficient of $1/n^2$.

Figure 13:
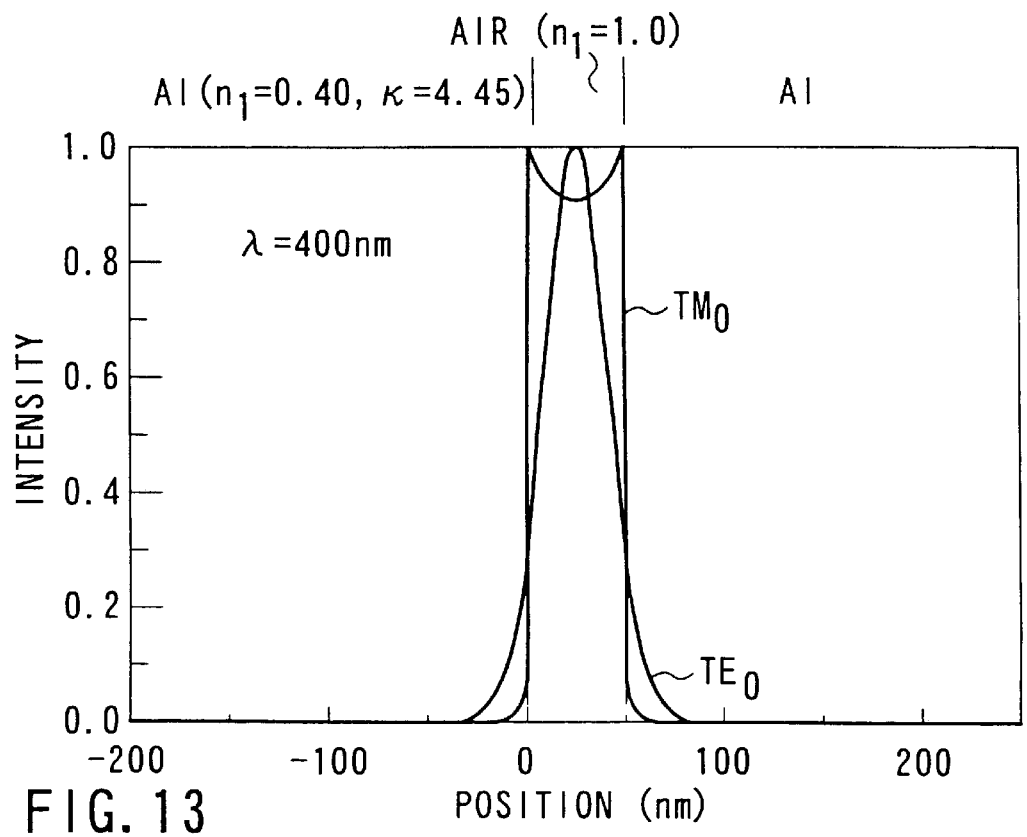
FIG. 13 shows the state of the waveguide mode relative to a Al aperture in the first embodiment of the present invention, covering the case where the light source wavelength is 400 nm.

On the other hand, the absolute value in the real part of $n^2$ in an aluminum (Al) film ($n_1^2 - \kappa^2 = -19.64$) is larger than 1 by at least one order of magnitude in 400 nm, too. As a result, the TM mode is greatly attenuated within the metal, leading to a small absorption loss, as shown in FIG. 13.

Figure 14:
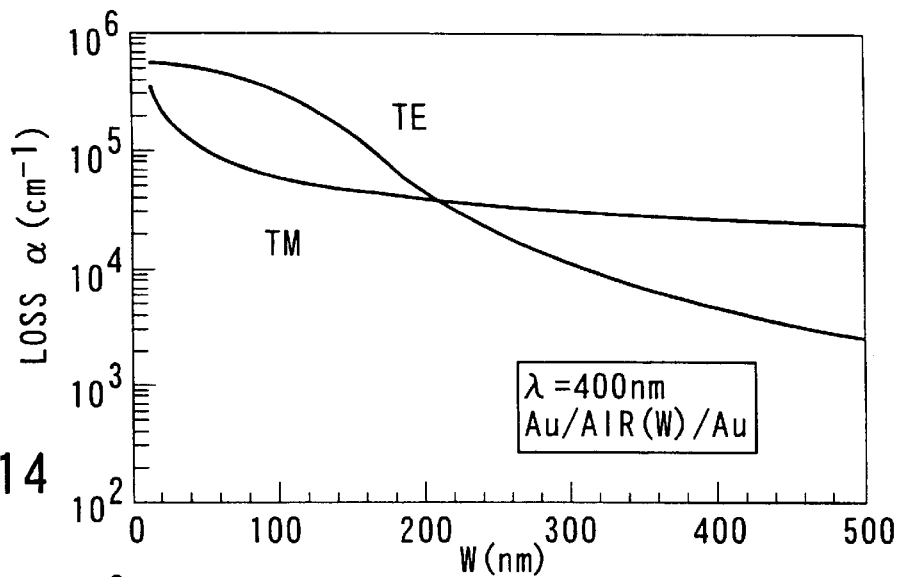
FIG. 14 shows an example of calculating the dependence of the waveguide mode loss in a Au waveguide on the aperture width W in the first embodiment of the present invention ($\lambda$=400 nm)
Figure 15:
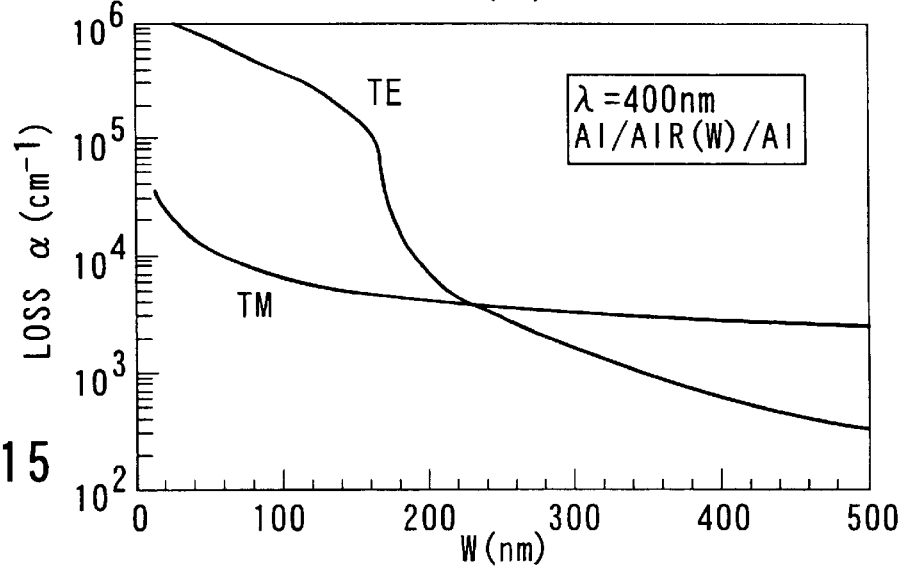
FIG. 15 shows an example of calculating the dependence of the waveguide mode loss in an Al waveguide on the aperture width W in the first embodiment of the present invention ($\lambda$=400 nm)

FIGS. 14 and 15 quantitatively show the situations. As apparent from FIGS. 14 and 15, it is desirable to use, for example, aluminum for forming the light absorption film for a short wavelength of 400 nm, though it is possible to use an optional material for forming the light absorption film 13, as far as the material has an absolute value, which is larger than 1, in the real part of the square of the refractive index ($n_1^2 - \kappa^2$) under the oscillation wavelength λ.

According to the embodiment described above, the direction of the short aperture width $W_1$ of a fine aperture is set in parallel to the polarizing direction of the semiconductor laser element 10 so as to make it possible to provide a semiconductor laser device that makes it possible to minimize the spot diameter of the laser beam and that has a high transmission efficiency of the laser light through the aperture.

Second Embodiment

Figure 16:
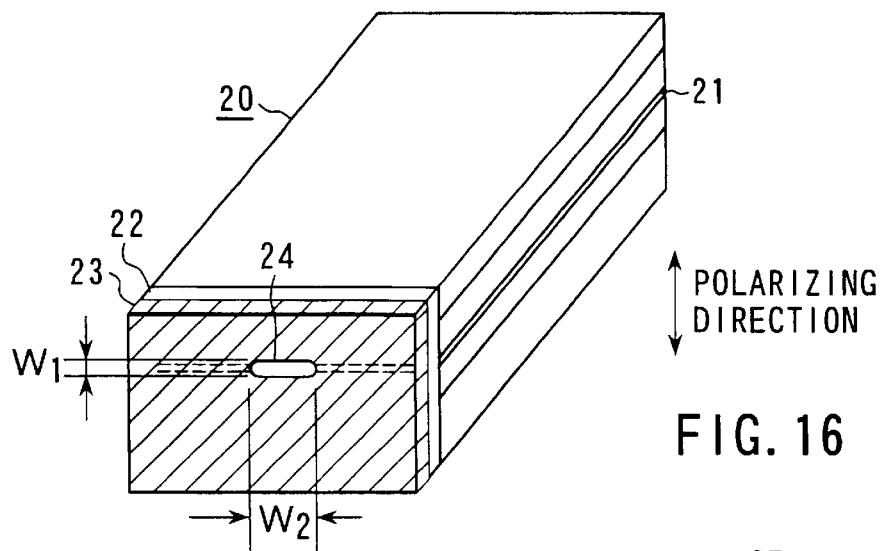
FIG. 16 is an oblique view showing schematically showing the construction of semiconductor laser device according to a second embodiment of the present invention.

FIG. 16 is an oblique view schematically showing the construction of a semiconductor laser device according to a second embodiment of the present invention. As shown in the drawing, the semiconductor laser device comprises a semiconductor laser device 20 having an active layer 21 arranged therein and having the facet protected by an insulating film 22 and a light absorption film 23 having a aperture 24. The polarizing direction of the laser is perpendicular to the junction plane, i.e., the direction of the electric field vector is perpendicular to the junction plane.

The second embodiment differs from the first embodiment in the polarizing direction of the laser light. It is possible to achieve a laser in which the polarizing direction is perpendicular to the junction plane as in the second embodiment by, for example, arranging an optical absorbing layer within a clad layer so as to make the loss of the TE mode larger than that of the TM mode, i.e., by arranging a light absorption layer in such a position, or by introducing a tensile strain into the active layer 21 so as to achieve a TM mode oscillation.

Since the polarizing direction is parallel to the vertical direction in the second embodiment, the aperture 24 formed in the light absorption film 23 extends in a lateral direction. In other words, the aperture width $W_1$ in a direction parallel to the polarizing direction is smaller than half the oscillating wavelength of the semiconductor laser, and the aperture width $W_2$ in a direction perpendicular to the polarizing direction is larger than the aperture width $W_1$. The particular construction of the second embodiment is advantageous in that the two dimensional shape in the oscillation mode of the semiconductor laser element can be made similar to the shape of the aperture. As a result, in addition to the effects produced by the first embodiment, an additional effect can be obtained that it is possible to allow the light output from the semiconductor laser element 20 to be incident highly efficiently on the aperture.

Third Embodiment

Figure 17:
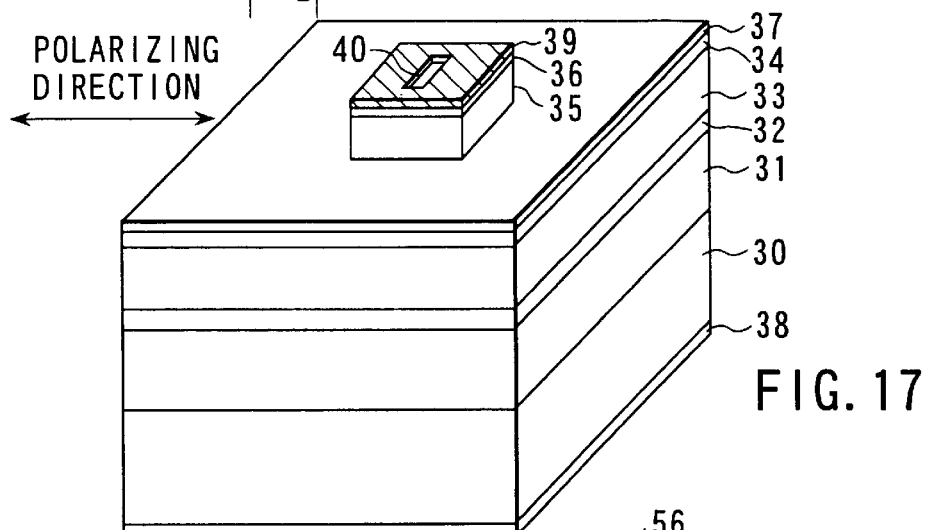
FIG. 17 is an oblique view showing schematically showing the construction of semiconductor laser device according to a third embodiment of the present invention.

FIG. 17 is an oblique views schematically showing the construction of a semiconductor laser device according to a third embodiment of the present invention. The semiconductor laser device shown in FIG. 17 comprises a surface-emitting type semiconductor laser element having an active layer 32 arranged therein and having the edge surface protected by an insulating film 36 and a light absorption film 39 having an aperture 40.

The surface-emitting type semiconductor laser element according to the third embodiment of the present invention comprises an n-type DBR reflection layer 31, an active layer region 32 having an optical thickness that is equal to the oscillation wavelength, a p-type DBR reflection layer 33 and a p-type contact layer 34, which are laminated one upon the other on one surface of an n-type semiconductor substrate 30.

A p-type contact layer 35 and an insulating film 36 are formed in the order mentioned on the surface of a part of the p-type contact layer 34, and a p-type electrode 37 is formed on the surface of the other part of the p-type contact layer 34. Further, an n-type electrode 38 is formed on the other surface of the n-type semiconductor substrate 30. The semiconductor laser element of the particular construction is called a vertical-cavity surface-emitting semiconductor laser element.

Still further, a light absorption film 39 having an aperture 40 is formed on the insulating film 36 of the semiconductor laser element.

The aperture width is small (λ/2 or less) in a direction parallel to the polarizing direction of the laser light and large in a direction perpendicular to the polarizing direction of the laser light in this embodiment, too, making it possible to decrease markedly the loss of light as already described in conjunction with the first and second embodiments.

The thicknesses of the insulating films 12, 22 and 36 used in the first, second and third embodiments, respectively, will now be described. As already described, the light can be attenuated sufficiently in the region other than the aperture if the thickness of each of the light absorption films 13, 23 and 39 is about 100 nm. The thickness noted above corresponds to an optical thickness of about λ (one wavelength). An ordinary metal film having a thickness of the level noted above exhibits a reflectance of at least 90% and, thus, is sufficiently effective when used as a reflector of a cavity.

However, where a metal film is formed to cover the facet of an edge-emitting type laser as in the first embodiment or the second embodiment, it is absolutely necessary to form the insulating film 12 or 22 between the facet and the metal film. Also, it is necessary to set the thickness of the insulating film 12 or 22 at a value at which a high reflectance can be ensured because the reflectance is decreased depending on the thickness of the insulating film. Incidentally, in the known semiconductor laser element failing to fall within the scope of the present invention, the reflectance of the insulating film need not be considered. In general, the thickness of the insulating film is set at $\lambda/4$.

Figure 18:
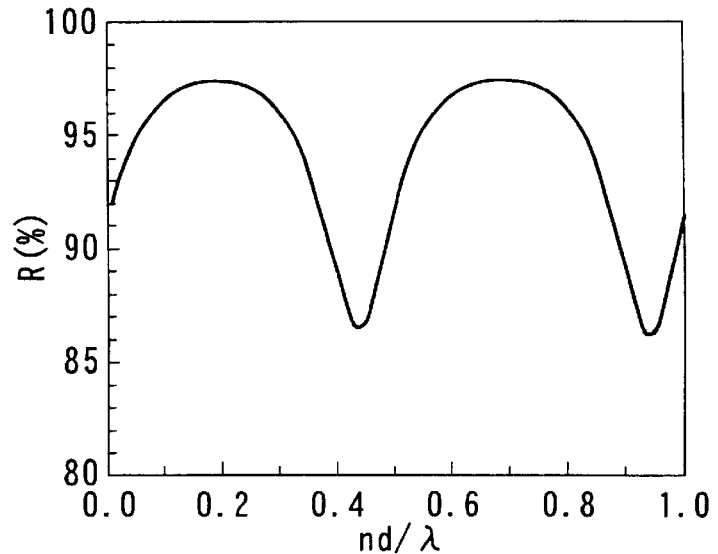
FIG. 18 shows an example of calculating the dependence of a reflectance R on the thickness d of an insulating film in the third embodiment of the present invention.

FIG. 18 is a graph showing an example of calculating the dependence of the reflectance R on the thickness d of the insulating film 12 or 22. In this calculation, the optical thickness of the gold (Au) film is set at $\lambda$ (one wavelength). However, since the gold film has a sufficiently large absorption coefficient, the dependence of the reflectance R on the thickness of the metal film is small. In the graph of FIG. 18, the reflectance R is plotted on the ordinate, with the optical thickness of the insulating film 12 or 22 normalized by the wavelength ($nd/\lambda$) plotted on the abscissa. As apparent from FIG. 18, the reflectance R is periodically increased and decreased. It can be understood from FIG. 18 that a high reflectance R is exhibited in the vicinity of the value denoted by formula (2):

$$nd/\lambda = 0.2 + 0.5\, m \quad (2)$$

where m represents an integer.

In order to obtain a reflectance R of, for example, at least 95%, d should be set to satisfy the relationship given by formula (3) below:

$$0.05 + 0.5\, m \leq nd/\lambda \leq 0.35 + 0.5\, m \quad (3)$$

Incidentally, since the insulating film sufficiently plays the role of a protective film even if the film is thin, it suffices to set the value $nd/\lambda$ of the insulating film 12 or 22 to fall within the range defined in formula (4) given below:

$$0.05 \leq nd/\lambda \leq 0.35 \quad (4)$$

As described above, according to the third embodiment, the effect similar to that produced by the first embodiment can be obtained in respect of the vertical-cavity surface-emitting type semiconductor laser device, too.

The present invention is not limited to each of the embodiments described above.

To be more specific, the semiconductor laser element in each of the embodiments described above is not limited to the element formed of the material specified in each of these embodiments. For example, it is possible to use various materials in the present invention including InGaAsP series, GaAlAs series, InGaAlP series, InGaAlN series, InGaAlBN series, InGaAsSb series, CdZnMgSSe series materials, etc.

Figure 19:
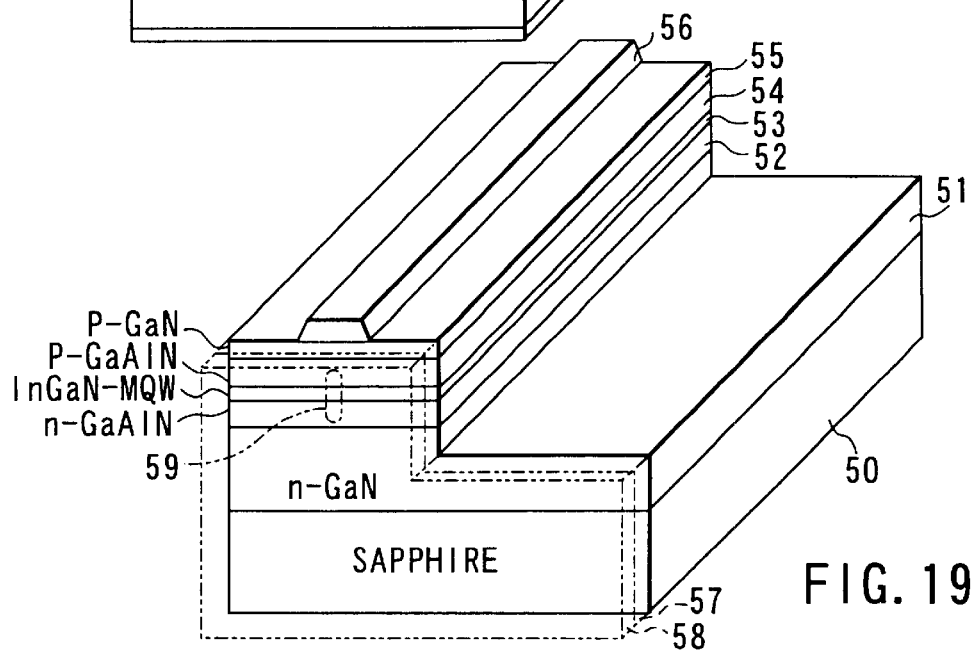
FIG. 19 is an oblique view schematically showing the construction of a semiconductor laser according to a modification of the third embodiment of the present invention.

Also, the laser structure is not limited to the structures shown in FIGS. 1A, 1B, 16 and 17, and the laser structure can be modified appropriately. For example, it is possible to use an insulating sapphire substrate 50 in place of the semiconductor substrate, as shown in FIG. 19. In the laser structure shown in FIG. 19, an n-type GaN layer 51, an n-type GaAlN clad layer 52, an MQW active layer 53 made of InGaN, a p-type GaAlN clad layer 54, a p-type GaN contact layer 55 and a ridge portion 56 are laminated one upon the other in the order mentioned on the sapphire substrate 50. Also, the laser facet (light-emitting surface) is covered with an insulating film 57.

In the case of the example shown in FIG. 19, the sapphire substrate 50 is an insulator. Therefore, each of the layers 52 to 55 is partly etched in the etching step until the etching proceeds to reach the clad layer 51, and an n-side electrode (not shown) is formed on the exposed clad layer 51. Also, a p-type electrode (not shown) is formed to cover the p-type GaN contact layer and the ridge portion 56. It should also be noted that a light absorption film 58 having an aperture 59 is formed on the insulating film 57 of the semiconductor laser element of the modification shown in FIG. 19. The aperture 59 is positioned to face a part of the light-emitting surface as in the embodiments described previously.

Incidentally, the inner space of each of the apertures 14, 24, 40 and 59 formed in the first to third embodiments is filled with air. Alternatively, it is possible for the inner space of the aperture to be filled partly or entirely with the insulating film 12, 22, 36 or 57.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor laser device, comprising:

a semiconductor laser element having a light-emitting surface from which a laser light having a wavelength $\lambda$ is emitted; and a light absorption film covering the light-emitting surface of said semiconductor laser element, the film having a slit for passing through the light emitted from the light-emitting surface, the slit having a first width W1 in a direction parallel to the polarizing direction of said laser light and a second width W2 in a direction perpendicular to the polarizing direction of the laser light;

wherein the first width W1 is shorter than half the wavelength $\lambda$ of semiconductor laser element and also is shorter than the second width W2.

2. The semiconductor laser device of claim 1, wherein the first width W1 is in a direction parallel to a longitudinal direction of an emitted-light pattern of said laser light.

3. The semiconductor laser device of claim 1, wherein the light absorption film is made of a thin metal.

4. The semiconductor laser device of claim 3, further comprising an insulating film between the light-emitting surface of the semiconductor element and the light absorption film.

5. The semiconductor laser device of claim 4, wherein the slit is filled partly or entirely with the insulating film.

6. The semiconductor laser device of claim 1, wherein the slit is filled with air.

7. A semiconductor laser device, comprising:

a semiconductor laser having a light-emitting surface from which a polarized laser light is emitted;

a protective film formed on the light-emitting surface of the semiconductor laser; and a metal film formed on the protective film and covering the light-emitting surface of said semiconductor laser, the metal film having an aperture for passing through the polarized laser light, the aperture having a first width W1 in a direction parallel to the polarizing direction of the laser light and a second width W2 in a direction perpendicular to the polarizing direction of the laser light;

wherein the first width W1 is shorter than half the wavelength $\lambda$ of the laser light and also is shorter than the second width W2.

8. The semiconductor laser device of claim 7, wherein the first width W1 of the aperture is 50 nm.

9. The semiconductor laser device of claim 7, wherein the thickness of the metal film is about 100 nm.

10. The semiconductor laser device of claim 7, wherein the thickness of the metal film is about one wavelength $\lambda$ of the laser light.

11. The semiconductor laser device of claim 7, wherein the thickness of the protective film is about one-fourth of wavelength $\lambda$ of the laser light.

12. The semiconductor laser device of claim 7, wherein the metal film is made of one selected from the group consisting of Ag, Cu, Pt and Ti.

13. The semiconductor laser device of claim 7, wherein the metal film is made of Au or Al.

* * * * *